(12) United States Patent
Zhang

(10) Patent No.: US 10,332,960 B2
(45) Date of Patent: Jun. 25, 2019

(54) DIGITALLY CONTROLLED VARACTOR STRUCTURE FOR HIGH RESOLUTION DCO

(71) Applicant: GLOBALFOUNDRIES INC., Grand Cayman (KY)

(72) Inventor: Chi Zhang, Allen, TX (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 184 days.

(21) Appl. No.: 15/370,004

(22) Filed: Dec. 6, 2016

(65) Prior Publication Data

US 2018/0159471 A1 Jun. 7, 2018

(51) Int. Cl.
| | |
|---|---|
| *H03B 5/12* | (2006.01) |
| *H01L 27/08* | (2006.01) |
| *H01L 27/12* | (2006.01) |
| *H01L 29/06* | (2006.01) |
| *H01L 29/76* | (2006.01) |
| *H01L 29/93* | (2006.01) |
| *H01L 29/94* | (2006.01) |

(52) U.S. Cl.
CPC ...... *H01L 29/0649* (2013.01); *H01L 27/0811* (2013.01); *H01L 27/1203* (2013.01); *H01L 29/76* (2013.01); *H01L 29/93* (2013.01); *H01L 29/94* (2013.01); *H03B 5/12* (2013.01); *H03B 5/1206* (2013.01); *H03B 5/1253* (2013.01); *H03B 2201/0208* (2013.01); *H03B 2201/0266* (2013.01)

(58) Field of Classification Search
CPC ..... H01L 29/06; H01L 27/12; H01L 27/0805; H01L 29/0649; H01L 29/93; H01L 29/94; H01L 29/76; H01L 27/1203; H01L 27/0811; H03H 7/0153; H03B 5/1206; H03B 5/1253; H03B 5/12; H03B 2201/0208; H03B 2201/0266
USPC ......... 331/167, 177 V, 117 FE; 257/288, 312
See application file for complete search history.

(56) References Cited

U.S. PATENT DOCUMENTS

| | | | |
|---|---|---|---|
| 7,071,790 B2 * | 7/2006 | Darabi | H03B 5/1206 331/117 FE |
| 9,941,348 B2 * | 4/2018 | Yan | H01L 28/84 |

(Continued)

OTHER PUBLICATIONS

Staszewski, "A Digitally Controlled Oscillator in a 90nm Digital CMOS Process for Mobile Phones", Journal, Nov. 2005, pp. 2203-2211, vol. 40 No. 11, IEEE Journal of Solid-State Circuits.

(Continued)

*Primary Examiner* — Arnold M Kinkead
(74) *Attorney, Agent, or Firm* — David Cain; Hoffman Warnick LLC

(57) ABSTRACT

A digitally controlled varactor device comprising: a set of bulk nMOS field effect transistors bulk tied to a ground, the set bulk nMOS field effect transistors having: a first transistor including: a source coupled to a DC voltage source; and a gate coupled to a digitally controlled oscillator; a second transistor including: a source coupled to the DC voltage source; and a gate coupled to the digitally controlled oscillator; and a third transistor including: a source coupled to a drain of the first transistor; and a drain coupled to a drain of the second transistor. The transistors in the digitally controlled varactor may be FDSOI nMOS devices with backgate coupled to a DC voltage source.

18 Claims, 9 Drawing Sheets

(56) References Cited

U.S. PATENT DOCUMENTS

2006/0091968 A1    5/2006   Darabi et al.
2014/0049315 A1    2/2014   Doris et al.

OTHER PUBLICATIONS

Vercesi, "A Dither-Less All Digital PLL for Cellular Transmitters", Journal, Jun. 12, 2012, pp. 1908-1920, vol. 47 No. 8, IEEE Journal of Solid-State Circuits.
Kavala, "A 5.6 GHz LC Digitally Controlled Oscillator with High Frequency Resolution using Novel Quadruple Resolution Varactor", Journal, pp. 279-282, ISOCC.
Wang, A Digital Intensive Fractional-N PLL and All-Digital Self-Calibration Schemes, Journal, Jul. 22, 2009, pp. 2182-2192, vol. 44 No. 8, IEEE Journal of Solid-State Circuits.
TW Examination Report and English translation thereof for Taiwanese Patent Application No. 106125710 dated Oct. 24, 2018, 11 pages.

* cited by examiner

DIGITALLY CONTROLLED VARACTOR STRUCTURE FOR HIGH RESOLUTION DCO

TECHNICAL FIELD

The subject matter disclosed herein relates to integrated circuits. More particularly, the present invention relates to a metal oxide semiconductor (MOS) varactor.

BACKGROUND

These varactors are semiconductor diodes with a capacitance that is dependent on the applied voltage and are commonly used in modern communication systems. Integrated circuits often include varactors ("variable reactors"). Varactors provide a voltage controlled capacitive element that has a variable capacitance based on the voltage expressed at the terminals and a control voltage. Metal oxide semiconductor (MOS) varactors may have a control voltage applied to a gate terminal that provides a control on the capacitance obtained for a particular voltage applied on the remaining terminals of the device.

Because a varactor is based on a reverse biased P-N junction, the terminals are typically biased such that no current flows across the P-N junction, thereby forming a capacitor. However, varying the bias on the gate of a MOS varactor causes the formation of a depletion or an accumulation region under the gate, changing the current flow through the varactor. The effective capacitance obtained is thus variable, and, voltage dependent. This makes the varactor useful as a voltage controlled capacitor. Varactors are particularly useful in oscillators, RF circuits and in conventional communication technologies to generate given frequencies used as input signals.

Two types of conventional MOS varactors are often used. One type is an n-MOS accumulation-type varactor that has a simple implementation. However, in an n-MOS accumulation-type varactor, a parasitic diode is turned on when Vcontrol<0 because the substrate is shorted to ground. This results in a low Q factor during half of the tuning range. The other type is an inversion MOS varactor, which has a parasitic diode that is always reverse biased, preventing leakage to the substrate. However, an inversion MOS varactor has a narrow tuning range.

The conventional varactor applications use control systems such as phase-locked loops (PLLs) to generate output signals in response to a given input signal. PLLs are essential circuits used for a variety of timing, synchronization, and signal processing functions in a range of electronic applications. An important application of PLLs is in telecommunication and radar systems, where they are used to generate the carrier frequencies, local oscillator frequencies, and intermediate frequency signals. The present trend in wireless communication systems is towards the use of all-digital PLLs (ADPLLs), which offer the advantages of smaller chip size, better scalability, and extensive re-configurability compared to traditional, analog, PLLs.

SUMMARY

A first aspect of the present disclosure provides a digitally controlled varactor device using a set of bulk nMOS field effect transistors bulk tied to a ground, the set bulk nMOS field effect transistors having: a first transistor including: a source coupled to a DC voltage source; and a gate coupled to a digitally controlled oscillator; a second transistor including: a source coupled to the DC voltage source; and a gate coupled to the digitally controlled oscillator; and a third transistor including: a source coupled to a drain of the first transistor; and a drain coupled to a drain of the second transistor.

A second aspect of the present disclosure provides a digitally controlled varactor device using a set of FDSOI nMOS field effect transistors gate coupled to a backgate voltage connected to a Vbb potential voltage, the FDSOI nMOS field effect transistors having: a first transistor including: a source coupled to a DC voltage source; and a gate coupled to a digitally controlled oscillator; a second transistor including: a source coupled to the DC voltage source; and a gate coupled to the digitally controlled oscillator; and a third transistor including: a source coupled to a drain of the first transistor; and a drain coupled to a drain of the second transistor.

A third aspect of the present disclosure provides a method of achieving very fine frequency tuning resolution, using: determining a DC bias voltage to a digitally controlled oscillator inductor capacitor (DCO LC) tank that is gate connected to a first NMOS transistor device, and a second NMOS transistor device; applying a DC biased voltage to a node that is connected to a source of the first NMOS transistor device, and a source of the second NMOS transistor device; generating a control signal received by a gate of a third NMOS transistor device; setting a backgate voltage of the first NMOS transistor device, and the second NMOS transistor device, and the third NMOS transistor device to ground; and adjusting the backgate voltage to reconfigure a tuning range of the DC biased voltage and the control signal.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
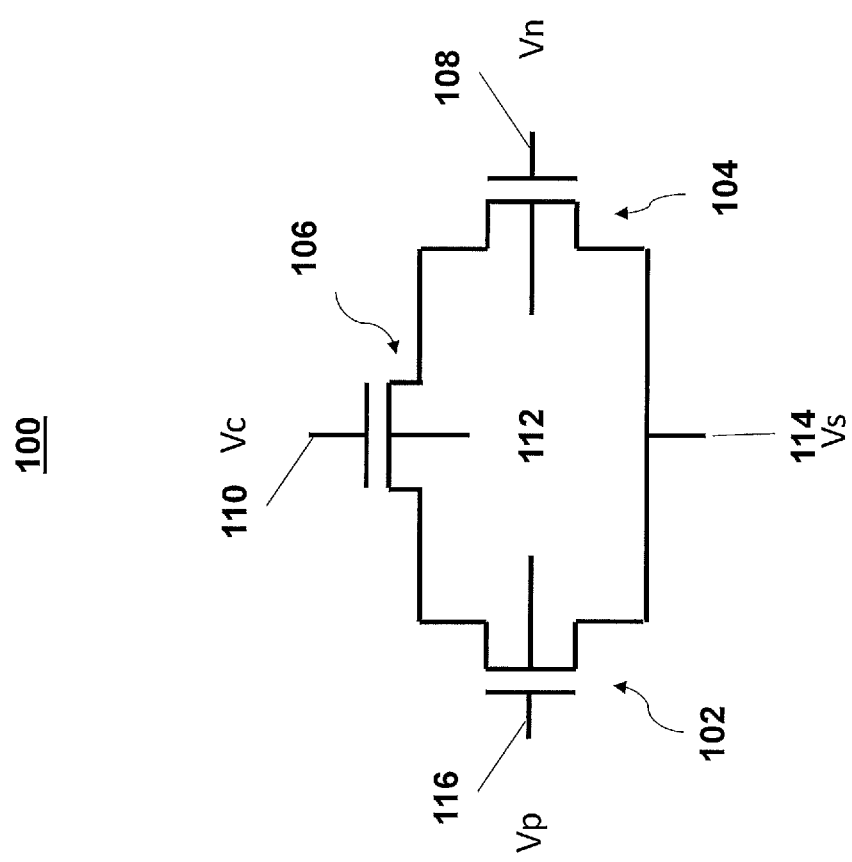
FIG. 1 depicts a schematic diagram of a varactor circuit according to embodiments of the present disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

As noted above, the subject matter disclosed herein relates to integrated circuits. More particularly, the subject matter relates to metal-oxide semiconductor (MOS) varactors with fine signal resolutions. Furthermore, this disclosure relates to embodiments of a method and an apparatus for a digitally controlled oscillator (DCO) with an advanced digital phase-locked loop (ADPLL) with a very fine resolution. The resolution is mainly determined by the capacitance tuning resolution of a digitally controlled varactor (DCV). The resolution of the DCV is determined by the capacitance on (Con) and capacitance off (Coff) used in the switch actuation voltage of the DCV device, and is based upon the capacitance change per fine code step. Additionally, in conventional varactors, the Con is always equal to the oxide capacitance, gate to channel (Cox) of the device when they are formed. Since a higher Cox is desired in these conventional applications for higher device speed, there is a tradeoff in the resolution capabilities. The current approach avoids this tradeoff.

The proposed embodiment of this invention is a varactor that in one embodiment consists of three NMOS transistors configured differentially to form a 3-fingered device. The embodiments of this disclosure do not require AC coupling capacitors, or DC bias resistors, which results in reduced parasitic diode current leakage, and space savings on each device.

Referring to FIG. 1, a varactor 100 according to embodiments of the present disclosure is shown. More specifically, the varactor 100 is a flipped well NMOS in FDSOI process, acting as a switchable differential capacitor. As will be presented in greater detail below, compared to conventional varactors, the configuration of the varactor 100 significantly improves fine resolution performance (approximately 22 aF capacitance change per step), fine tuning capacitance range (approximately 23 fF for 10-bit tuning word), lower parasitic capacitance and lower sensitivity on bias voltages that would significantly reduce phase noise. According to one embodiment of Varactor 100, the device includes a series of transistors. This series of transistors may include a first transistor 102, a second transistor 104, and a third transistor 106.

Further referring to FIG. 1, the first transistor 102 and the second transistor 104 are source coupled to a DC voltage source 114 (Vs) node that is DC biased at approximately 0.5 volts to ensure that the first transistor 102 and the second transistor 104 remain in an off state. The first transistor 102 is also gate coupled to a digitally controlled oscillator LC tank providing a voltage 116 (Vp) of approximately 0.5 volts, while the second transistor 104 is gate coupled to the digitally controlled oscillator providing a voltage (Vn) of approximately 0.5 volts. The third transistor 106 is source coupled to a drain of the first transistor 102; and a drain coupled to a drain of the second transistor 104. The gate of the third transistor 106 receives the voltage control signal (Vc) 110 of the varactor, which is approximately 0-1.2 volts, allowing the third transistor to be in an on state when Vc 110 is approximately at 1.2 volts, and in an off state when Vc 110 is approximately at 0 volts. The bulk or the backgate voltage (Vbb) 112 of the first transistor 102, the second transistor 104, and the third transistor 106 are tied to ground in a bulk process, or a chosen voltage potential in a FDSOI process. By altering Vbb 112, the Vc 110 and Vs 114 voltages are allowed to be operated at a given range to control the first transistor 102 and the second transistor 104 to ensure operation in the desired off state.

Figure 2:
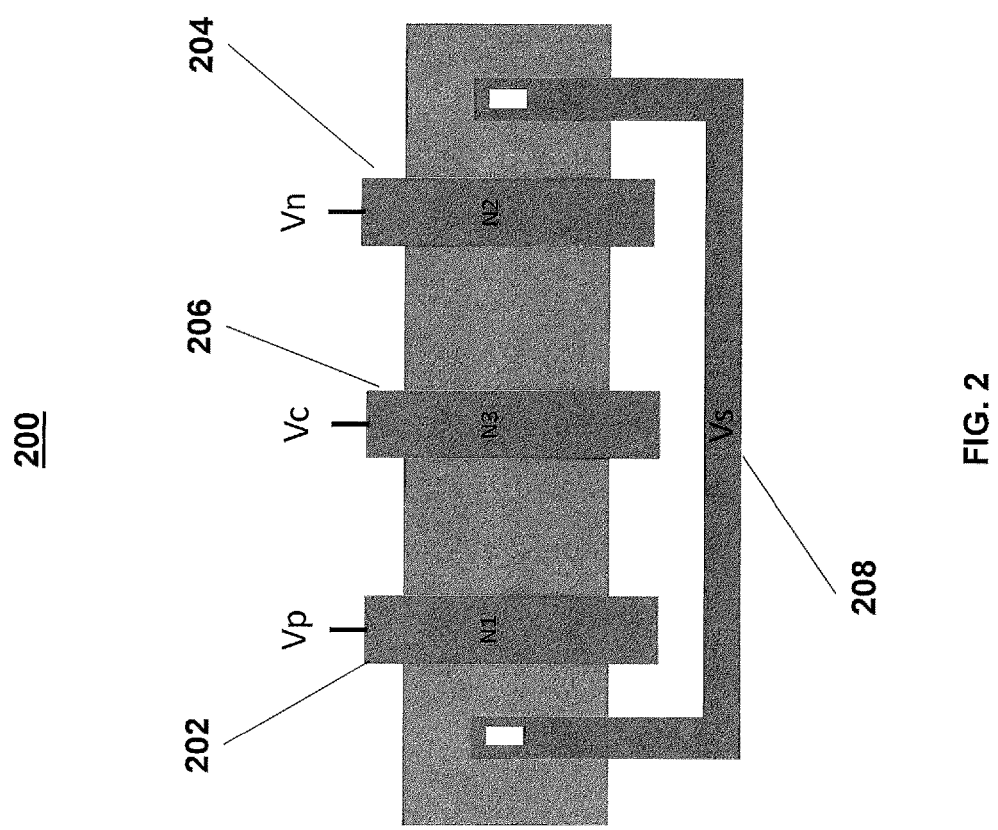
FIG. 2 depicts a simplified layout diagram of a varactor structure according to embodiments of the present disclosure.

Referring to FIG. 2, a simplified varactor structure 200 according to embodiments of the present disclosure is shown. Varactor structure 200 includes a series of three transistor devices. This series of transistor devices may include a first transistor 202, a second transistor 204, and a third transistor 206. As embodied in varactor structure 200, the drains of the first transistor 202 and the second transistor 204 are floating, and the third transistor 206 is acting as a switch. The first transistor 202 and the second transistor 204 are sharing a common Vs node 208 at a voltage of approximately 0.5 volts such that the device is operating with the first transistor 202 and the second transistor 204 in the off state.

Figure 3:
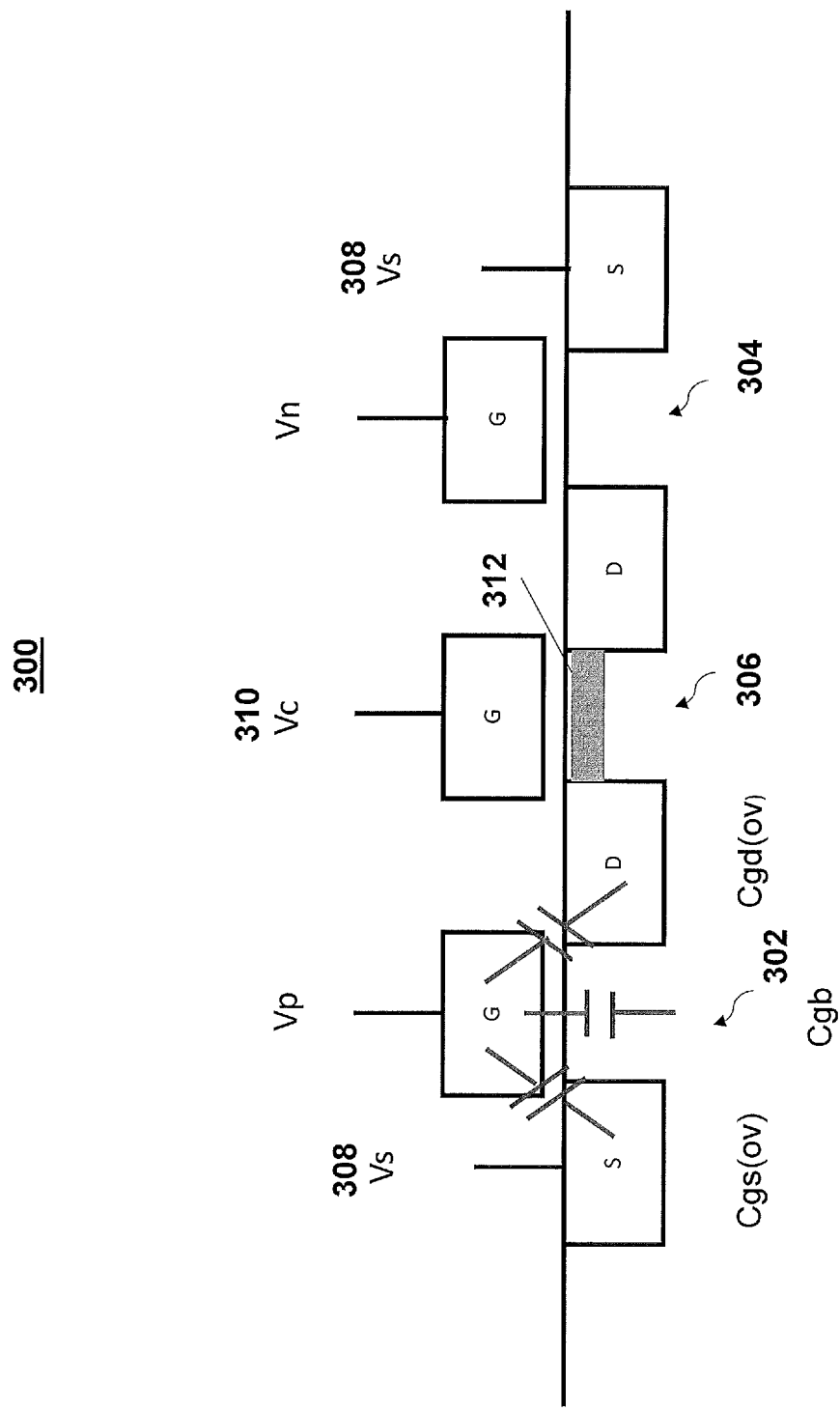
FIG. 3 depicts a simplified varactor fine unit model of an IC structure according to one embodiment of the present disclosure.

Referring to FIG. 3, a simplified varactor fine unit 300 model of the IC structure according to an embodiment of the present disclosure is shown. Varactor fine unit 300 includes a series of three transistor devices. This series of transistor devices may include a first transistor 302, a second transistor 304, and a third transistor 306. As embodied in varactor fine unit 300, when the varactor fine unit is in the off state, meaning that the source voltage 308 of the first transistor 302 and the second transistor 304 are set to approximately 0.5 volts (Vs). The third transistor 306 is also off since the control voltage 310 (Vc) is set at approximately 0.0 volts. In this embodiment, the drains of the first transistor 302 and the second transistor 304 are floating, with no channel being formed under the third transistor 306. The gate capacitance of the first transistor 302, and the second transistor 304 is approximately given by Cgs (ov)+Cgb where Cgs (ov) is the gate to source overlap capacitance of the first transistor 302 and the second transistor 304 and Cgb is the gate to bulk (or backgate voltage in FDSOI technologies). The differential varactor capacitance in this embodiment is given by the equation $Cv\_off=(Cgs(ov)+Cgb)/2$.

Referring further to FIG. 3, when the varactor fine unit 300 is in the on state, the source voltage 308 of the first transistor 302 and the second transistor 304 is set to approximately 0.5 volts (Vs), and the third transistor 306 is in the on state since the control signal voltage 310 (Vc) is set at approximately 1.2 volts. In this embodiment, in this on state, a virtual ground 312 is formed at the center of the third transistor channel, and the gate capacitance of the first transistor and the second transistor becomes Cgs(ov)+Cgd (ov)+Cgb. The differential varactor capacitance in this embodiment, in the on state, is given by the equation $Cv\_on=(Cgs(ov)+Cgd(ov)+Cgb)/2$. The gate to source overlap capacitance and the gate to drain overlap capacitance have the same value for a fully symmetric MOS process. The overall varactor capacitance difference between the on/off stages is approximately Cgs(ov)/2, and under this preferred embodiment; with Cgs(ov) dependent on the channel width (W), oxide thickness (tox), overlap length, gate height and drain junction depth.

Figure 4:
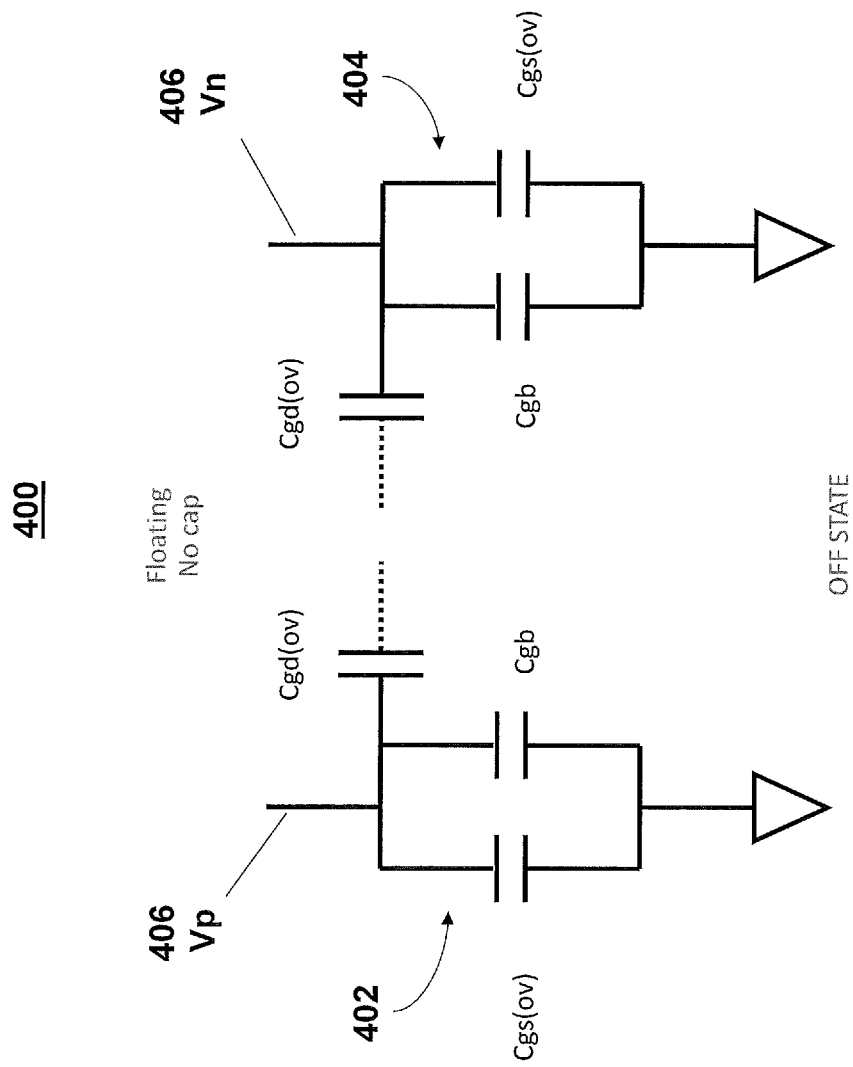
FIG. 4 depicts a simplified model of a varactor circuit in the off state according to one embodiment of the present disclosure.

Referring to FIG. 4, a simplified varactor model 400 is shown. This simplified varactor model 400 depicts the first transistor 402 and the second transistor 404 as they would be configured when the varactor fine unit 300 (FIG. 3) is in the off state. The differential varactor capacitance in this embodiment is given by the equation Cv_off=(Cgs(ov)+Cgb)/2.

Figure 5:
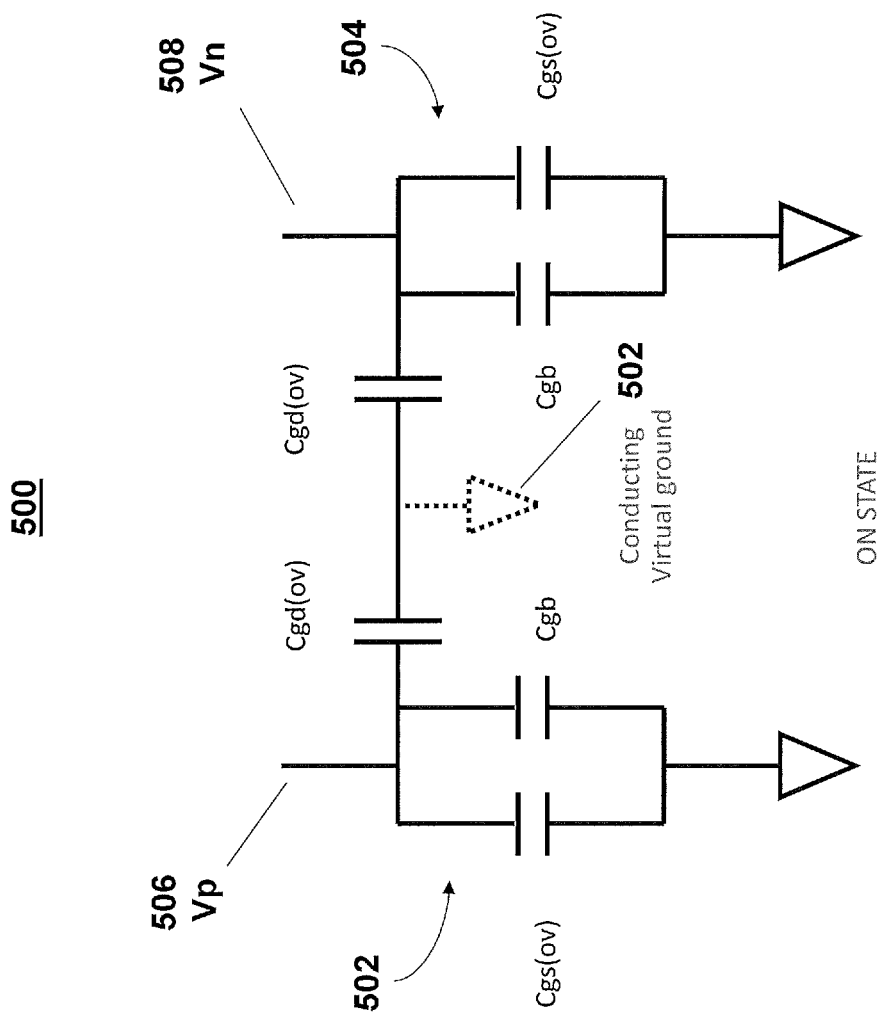
FIG. 5 depicts a simplified model of a varactor circuit in the on state according to one embodiment of the present disclosure.

Referring to FIG. 5, a simplified varactor model 500 is shown. This simplified varactor model 500 depicts the first transistor 502 and the second transistor 504 as they would be configured when the varactor fine unit 300 (FIG. 3) is in the on state. When the varactor fine unit 300 is in the on state, the source voltage 308 of the first transistor 302 and the second transistor 304 is set to approximately 0.5 volts (Vs), and the third transistor 306 is in the on state since the control signal voltage 310 (Vc) is set at approximately 1.2 volts. In this embodiment, in this on state, a virtual ground 510 is formed at the center of the third transistor's channel (not shown for clarity). The differential varactor capacitance in this embodiment, in the on state, is given by the equation Cv_on=(Cgs(ov)+Cgd(ov)+Cgb)/2.

Figure 6:
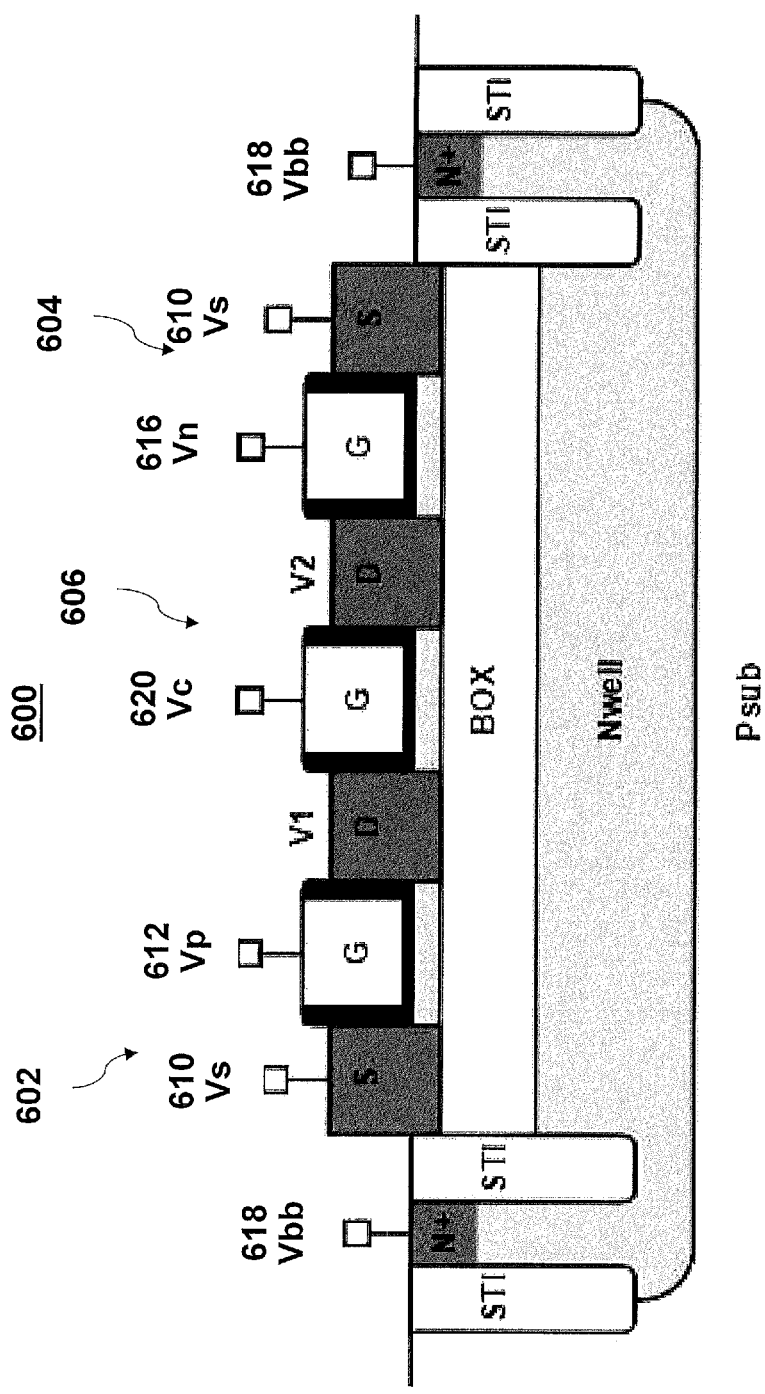
FIG. 6 depicts a varactor fine unit physical design cross section of an IC structure according to one embodiment of the present disclosure.

Referring to FIG. 6, a varactor fine unit physical design cross section 600 within an IC structure according to an embodiment of the present disclosure is shown. Varactor fine unit physical design cross section 600 includes a series of three transistor devices, and acts as a switched differential capacitor, replacing the metal oxide metal capacitors used in conventional VCO technologies with the operational capacitance of this device. This series of transistor devices may include a first transistor 602, a second transistor 604, and a third transistor 606. The first transistor 602 and the second transistor 604 are source coupled to a DC voltage source 610 node. The first transistor 602 is also gate coupled to a digitally controlled oscillator LC tank providing a voltage 612 (Vp), while the second transistor 604 is gate coupled to the digitally controlled oscillator LC tank providing a voltage 616 (Vn). The third transistor 606 is source coupled to a drain of the first transistor 602; and a drain coupled to a drain of the second transistor 604. The gate of the third transistor 606 receives the voltage control signal (Vc) 620 of the varactor, allowing for the third transistor to be configured to an on state, or off state depending upon the voltage of Vc 620. The bulk or backgate voltage (Vbb) 618 of the first transistor 602, the second transistor 604, and the third transistor 606 are tied to ground in a bulk process, or at a chosen voltage potential in a FDSOI process. By altering Vbb 618, the Vc 620 and Vs 610 voltages are allowed to be operated at a given range to control the first transistor 602 and the second transistor 604 to ensure operation in the desired off state.

Figure 7:
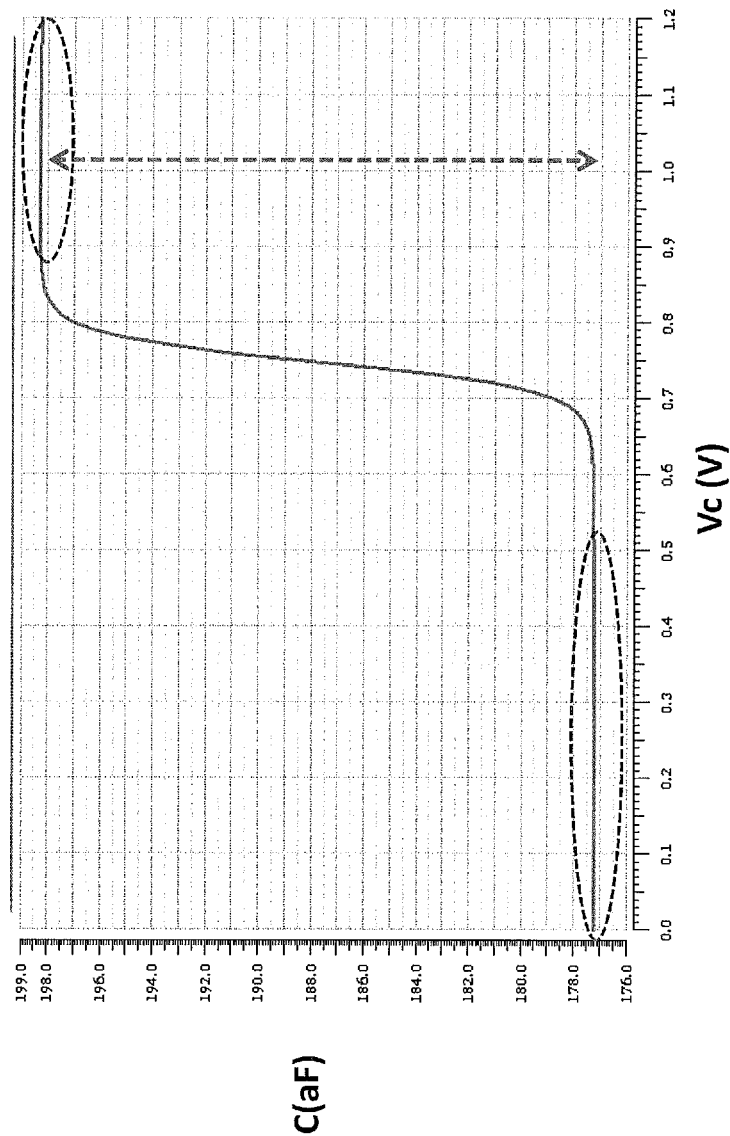
FIG. 7 is a chart depicting varactor device's capacitance versus voltage according to embodiments of the present disclosure.

Referring to FIG. 7, a chart 700 depicting a varactor device's general capacitance versus voltage according to alternate embodiments of the present disclosure is shown. As shown in the chart 700, the change in the capacitance is shown to be approximately 22 aF over the course of the switching voltage (approximately 1.2 v) of the control signal. In response to the signal possessing a wide, flat, band shown in chart 700 at the on/off states, the digitally controlled oscillator is generally unaffected by any DC bias noise of the input voltages. This general capacitance characteristic as shown in the chart 700 can be adjusted with permutations to the channel's length and width.

Figure 8:
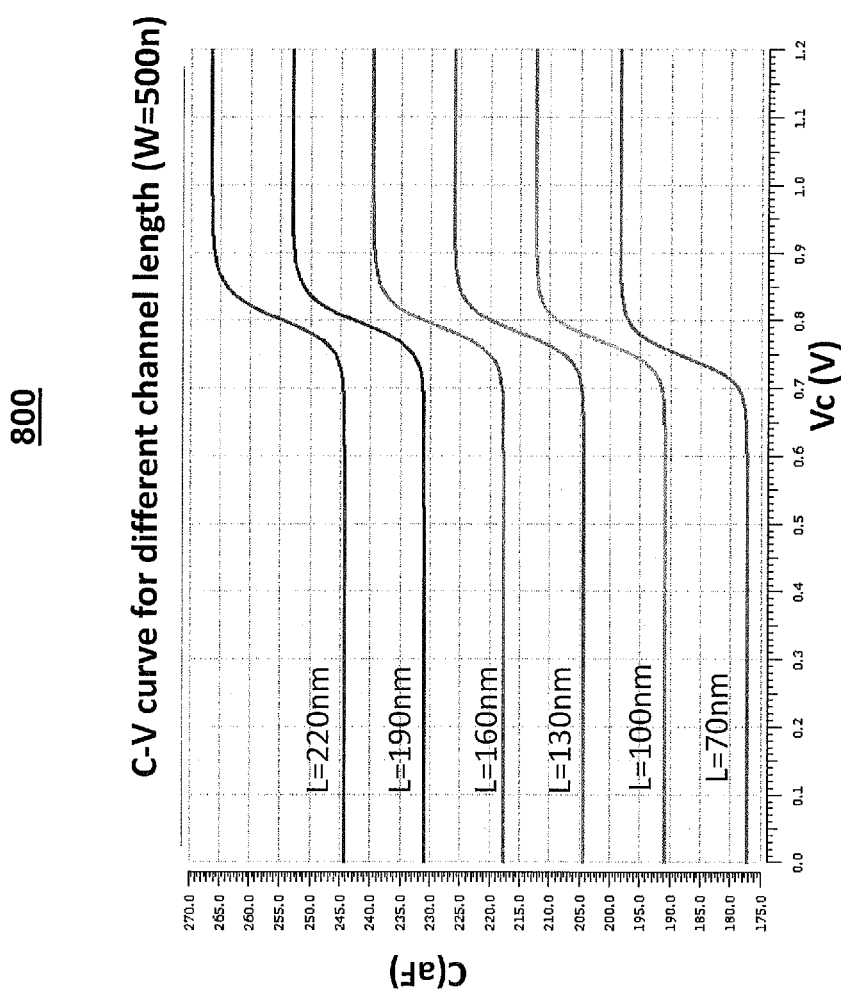
FIG. 8 is a chart depicting a varactor device's capacitance versus voltage according to alternate embodiments of the present disclosure.

Referring to FIG. 8, a chart 800 depicting a varactor device's capacitance versus voltage according to alternate embodiments of the present disclosure is shown. Chart 800 depicts embodiments of the proposed varactor device when you keep the channel width consistent while varying the varactor device's channel lengths. Chart 800 further illustrates that the change in capacitance remains constant for the permutations in channel length while enabling an adjustable tuning range.

Figure 9:
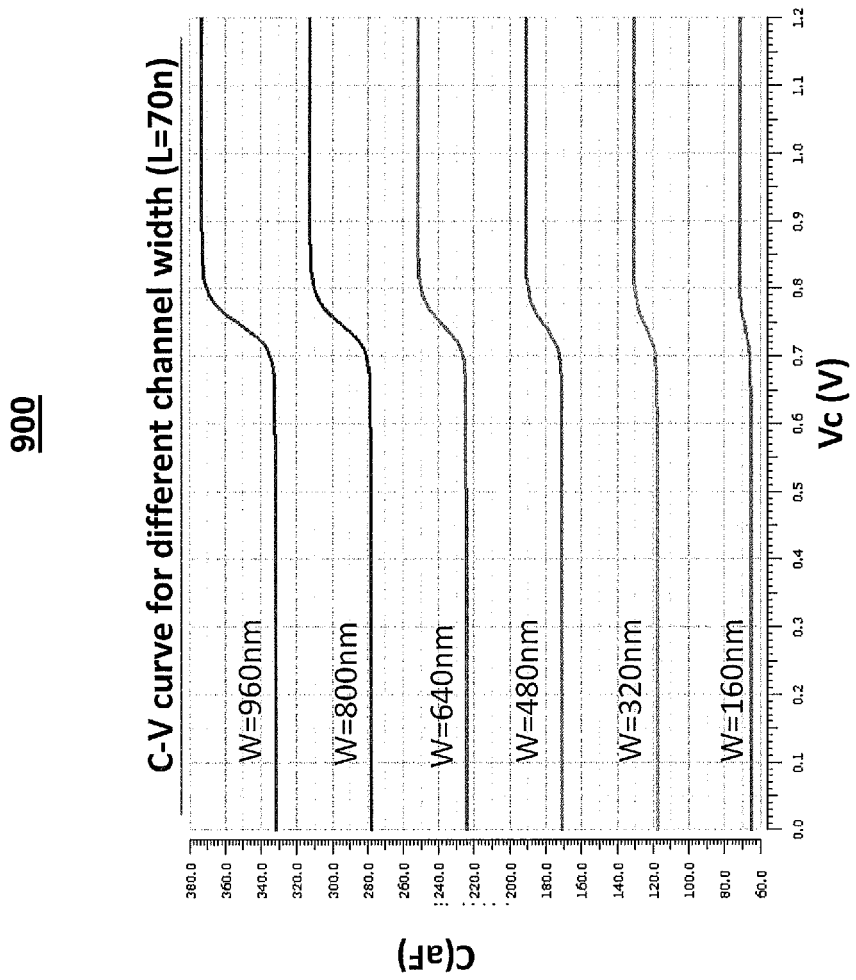
FIG. 9 is a chart depicting a varactor device's capacitance versus voltage according to alternate embodiments of the present disclosure.

Referring to FIG. 9, a chart 900 depicting a varactor device's capacitance versus voltage according to alternate embodiments of the present disclosure is shown. Chart 900 illustrates embodiments of the proposed varactor device when you keep the channel length consistent while varying the varactor device's channel widths. The fine unit achieves a fine resolution of approximately 22 aF capacitance step, and the step becomes smaller as the width of the channel decreases. The benefit of the larger widths is that the range of the fine tuning ratio is increased.

The terminology used herein is for the purpose of describing particular example embodiments only and is not intended to be limiting. As used herein, the singular forms "a," "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A digitally controlled varactor device comprising:
a set of bulk nMOS field effect transistors bulk tied to a ground, the set bulk nMOS field effect transistors having:
a first transistor including:
a source coupled to a DC voltage source; and
a gate coupled to a digitally controlled oscillator;
a second transistor including:
a source coupled to the DC voltage source; and
a gate coupled to the digitally controlled oscillator; and a third transistor including:
    a source coupled to a drain of the first transistor; and
    a drain coupled to a drain of the second transistor,
    wherein a gate of the first transistor and a gate of the second transistor are coupled to the positive and negative nodes of a digitally controlled oscillator's LC tank.

2. The device of claim 1, wherein the digitally controlled oscillator's LC tank is biased at approximately 0.5 volts.

3. The device of claim 1, wherein the DC voltage source provides 0.5 volts to set the first transistor and the second transistor in an off state.

4. The device of claim 1, wherein a gate of the third transistor receives a control signal.

5. The device of claim 4, wherein the control signal is in a voltage range of approximately 0 to 1.2 volts.

6. The device of claim 5, wherein:
    in response to the control signal being set to approximately 0 volts, the third transistor is set to an off state; and
    in response to the control signal being set to approximately 1.2 volts, the third transistor is set to an on state.

7. The device of claim 1, wherein the gate of the first transistor and the gate of the second transistor receives a configurable range of voltages through adjustment of a backgate voltage thereof.

8. A digitally controlled varactor device comprising:
    a set of FDSOI nMOS field effect transistors gate coupled to a backgate voltage connected to a Vbb potential voltage, the FDSOI nMOS field effect transistors having:
    a first transistor including:
        a source coupled to a DC voltage source; and
        a gate coupled to a digitally controlled oscillator;
    a second transistor including:
        a source coupled to the DC voltage source; and
        a gate coupled to the digitally controlled oscillator; and
    a third transistor including:
        a source coupled to a drain of the first transistor; and
        a drain coupled to a drain of the second transistor,
    wherein a gate of the first transistor and a gate of the second transistor are coupled to the positive and negative nodes of a digitally controlled oscillator's LC tank.

9. The device of claim 8, wherein the digitally controlled oscillator's LC tank is biased at approximately 0.5 volts.

10. The device of claim 8, wherein the DC voltage source is receiving 0.5 volts to set the first transistor and the second transistor in an off state.

11. The device of claim 8, wherein a gate of the third transistor receives a control signal.

12. The device of claim 11, wherein the control signal is in a voltage range of approximately 0 to 1.2 volts.

13. The device of claim 8, wherein:
    in response to the control signal being set to approximately 0 volts, the third transistor is set to an off state; and
    in response to the control signal being set to approximately 1.2 volts, the third transistor is set to an on state.

14. The device of claim 8, wherein the varactor device possesses a range of voltages for a gate of the first transistor and a gate of the second transistor through adjustment of the Vbb potential voltage.

15. A method of achieving very fine frequency tuning resolution, comprising:
    applying a bias voltage to a digitally controlled oscillator inductor capacitor (DCO LC) tank that is gate connected to a first NMOS transistor device, and a second NMOS transistor device;
    applying a DC biased voltage to a node that is connected to a source of the first NMOS transistor device, and a source of the second NMOS transistor device;
    generating a control signal received by a gate of a third NMOS transistor device;
    setting a backgate voltage of the first NMOS transistor device, and the second NMOS transistor device, and the third NMOS transistor device to ground; and
    adjusting the backgate voltage to reconfigure a tuning range of the DC biased voltage and the control signal.

16. The method of claim 15, wherein applying the bias voltage to the DCO LC tank includes:
    applying a voltage of approximately 0.5 volts to the DCO LC tank.

17. The method of claim 15, wherein the method includes an array of transistor devices in the DCO LC tank.

18. The method of claim 15, wherein generating the control signal includes:
    generating a range of control signals between approximately 0 to 1.2 volts:
        wherein keeping the first NMOS transistor device, and the second NMOS transistor device in the off state through the range;
        wherein in response to applying between approximately 0.0 to 0.6 volts to the control signal, the third transistor is set to an off state; and
        wherein in response to applying the between approximately 0.9 to 1.2 volts to the control signal, the transistor is set to an on state.

* * * * *